(12) United States Patent
Low

(10) Patent No.: US 8,338,236 B1
(45) Date of Patent: Dec. 25, 2012

(54) VENTED SUBSTRATE FOR SEMICONDUCTOR DEVICE

(75) Inventor: Boon Yew Low, Petaling Jaya (MY)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 13/160,521

(22) Filed: Jun. 15, 2011

(51) Int. Cl.
*H01L 21/00* (2006.01)
(52) U.S. Cl. ............... 438/127; 257/E21.504
(58) Field of Classification Search ........... 438/127; 257/787
See application file for complete search history.

(56) References Cited

U.S. PATENT DOCUMENTS

| | | | | |
|---|---|---|---|---|
| 5,939,778 A * | 8/1999 | Boutin et al. | | 257/678 |
| 6,794,223 B2 * | 9/2004 | Ma et al. | | 438/122 |
| 6,969,640 B1 | 11/2005 | Dimaano, Jr. | | |
| 7,186,589 B2 | 3/2007 | James et al. | | |
| 2002/0092162 A1 * | 7/2002 | Tsai et al. | | 29/840 |
| 2008/0150159 A1 * | 6/2008 | Aberin et al. | | 257/778 |

* cited by examiner

*Primary Examiner* — Lex Malsawma
(74) *Attorney, Agent, or Firm* — Charles Bergere

(57) ABSTRACT

A substrate with a vent for a semiconductor device where the vent is integrated within the substrate itself. The integrated air vent forms a passageway or relief path for gas or air within a mold cavity to escape during a transfer molding packaging process. The vents integrated in the substrate reduce trapped gas and mold voids and limit vent flash to improve yield.

4 Claims, 9 Drawing Sheets

VENTED SUBSTRATE FOR SEMICONDUCTOR DEVICE

BACKGROUND OF THE INVENTION

The present invention relates generally to semiconductor device packaging, and more particularly to a transfer molding process used to package semiconductor dies on substrates.

Semiconductor packages comprise integrated circuits and devices or dies that are attached or bonded to a top side of substrates or wafers. Typically, electrical interconnects such as vias and wire bonds form pathways to electrically interconnect the semiconductor dies to other devices or to a printed circuit board. Mold compound or encapsulant material forms a protective casing or shape of the finished semiconductor package to protect the delicate and fragile integrated circuits and electrical interconnects from moisture, electrical, physical and other environmental forces and stresses.

The process of packaging the integrated circuits and interconnects with the encapsulant or mold compound, such as epoxy resin, typically involves a transfer molding process. In the transfer molding process, the exposed bond wires, die and substrate are enclosed in a mold cavity formed by top and bottom mold forms. The top and bottom mold forms are clamped together on respective sides of the substrate, and the encapsulant or mold compound is injected into the mold cavity through an injection port. In an attempt to release air and prevent trapped air from forming within the encapsulant in the mold cavity during the transfer molding process, cavity bars with air vents are provided around the periphery of the mold cavity in either or both of the top or bottom mold forms. Although air vents are provided in an attempt to prevent mold voids, the inclusion of air vents introduces additional problems in the packaging process.

For example, the air vents are typically built on the mold chase, i.e., on the cavity bar of the mold forms. However, air may still be trapped in the cavity forming a mold void trap or excess encapsulant may escape through the air vents causing air vent flash that can lead to failure of the semiconductor package and lower mold yield. Another problem is uneven clamping force between the top and/or bottom mold forms and the surfaces of the substrate. The encapsulant or mold compound then may escape out of the mold cavity through any gaps formed from the uneven clamping between the mold form and the surface of the substrate causing air vent flash.

One common problem causing an uneven clamping force is a bulging effect that arises at the surface of the substrate in the air vent when the mold forms are clamped to the surface of the substrate. The bulging effect acts to reduce the cross-sectional area of the air vent and reduces the effectiveness of the air vents. The bulging effect arises from the different hardnesses of the materials of the mold forms and the surface of the substrate.

Typically, the surface of the substrate has a solder mask that is much softer than the harder material of the mold forms, which is usually a steel alloy. The clamping force of the mold forms on the surface of the substrate causes the softer solder mask material to bulge in the channel formed by the drain type air vent cavity bar thereby narrowing the cross-section of the air vent cavity bar and causing an uneven clamping force that reduces the air release effectiveness of the air vent cavity bar design. However, if clamping forces are reduced to eliminate the bulging effect, air vent flash incidence increases.

Other factors contributing to uneven clamping forces that lead to air vent flash and increased reject rates include, for example, wear and tear of air vent depth in the mold forms after repeated chemical cleaning solvent exposure and cavity bar or mold chase warpage. The surface of the air vent area of the cavity bar can become worn due to high clamp shearing pressures and chemical solvents used during sheet cleaning of the mold form after each use. As the mold form becomes worn, the air vent depth may become deeper reducing the effectiveness of the air vent and increasing the occurrence of air vent flash. Another factor of wear and tear is the metallurgy or the grain size of the cavity bars or mold form may increase, grow and expand after repeated exposure to high processing temperatures causing the cavity to warp and create uneven clamping forces.

Another factor contributing to uneven clamping forces arises in packaging systems with mold chase designs used for example with plastic ball grid array (PBGA) semiconductor packages that include a floating plate mechanism that may jam during processing. Such floating plate mechanisms are implemented in an attempt to compensate for the batch variations in substrate strip thickness and to ensure proper clamp force on the substrate to prevent solder mask crack and air vent flash. In such designs, any jam of the floating mechanism of the mold chase plate due for example to foreign matter stuck in the mechanism may cause an uneven clamping force that may result in air vent flash and increased reject rates. Thus, there is a need to address or at least alleviate some of the above problems.

BRIEF DESCRIPTION OF THE DRAWINGS

The accompanying drawings incorporated herein and forming a part of the specification illustrate several aspects of the present invention and, together with the description, serve to explain the principles of the invention. While the invention will be described in connection with certain embodiments, there is no intent to limit the invention to those embodiments described. On the contrary, the intent is to cover all alternatives, modifications and equivalents as included within the scope of the invention as defined by the appended claims. In the drawings:

DETAILED DESCRIPTION OF THE INVENTION

An aspect of the invention is a method of forming a packaged semiconductor, comprising of providing a substrate having a vent forming a hole from a first side of the substrate to a second side of the substrate; placing a semiconductor die on the first side of the substrate; clamping a first mold piece form to the first side of the substrate to form a mold cavity between the first mold piece form and the first side of the substrate with the semiconductor die; injecting a mold compound into the mold cavity, and the mold compound and gas within the mold cavity exiting the mold cavity through the vent in the first side of the substrate to the second side of the substrate, and exiting through a vent passageway; and removing the first mold form from the substrate to form the packaged semiconductor.

An embodiment of the invention further comprises clamping a second mold piece form to the second side of the substrate to extend the mold cavity between the second mold piece form to the second side of the substrate. An embodiment further comprises forming a vent channel in the second mold piece form extending from the vent of the second side of the substrate to the perimeter of the substrate when the second mold piece form is positioned and clamped next to the second side of the substrate. An embodiment further comprises forming a vent channel in the second side of the substrate extending from the vent of the second side of the substrate to the perimeter of the second side of the substrate.

Another aspect of the invention is a substrate for a semiconductor packaged device, the substrate comprising a substrate body having a first side and a second side; and a vent forming a hole from the first side of the substrate body to the second side of the substrate body. In an embodiment, the second side of the substrate body has a vent channel from the vent on the second side of the substrate to the perimeter of the second side. The vent may be formed by a side wall of the substrate, and the side wall may have a coating where the coating is electroless plating. It also should be noted that in the preferred embodiments of the invention described below, the substrate vent communicates with a vent channel located in the second or bottom mold form and that the top or first mold form that covers the substrate first side, die and wires connecting the die to the substrate does not include any vent holes.

Figure 1:
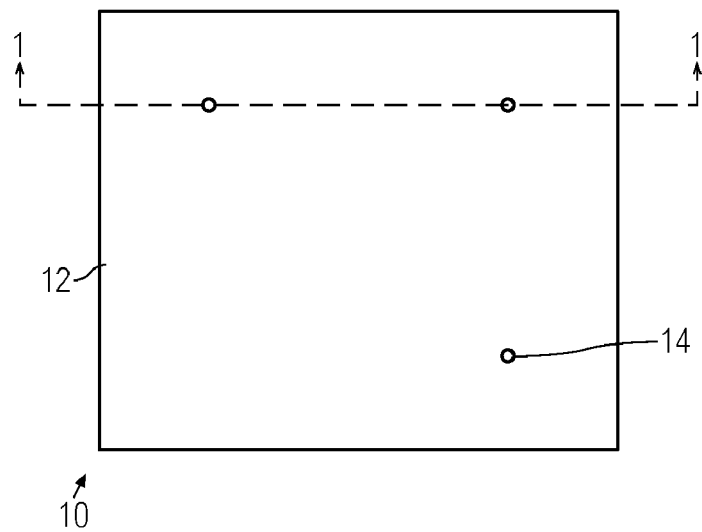
FIG. 1 is a simplified top plan view of a substrate with a vent in accordance with an embodiment of the invention.

Referring now to FIG. 1, a simplified top plan view of a substrate 10 in accordance with an embodiment of the invention is shown. A first side 12 or top surface of the substrate is shown with at least one vent 14 integrated within the substrate 10 itself.

Figure 2:
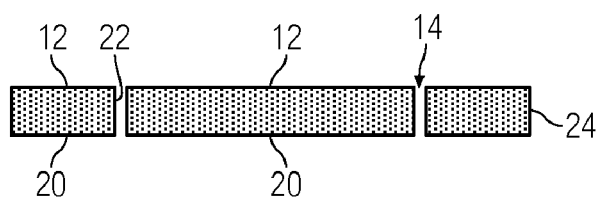
FIG. 2 is a simplified cross-sectional view taken from the dashed line 1-1 of FIG. 1 of a substrate with a vent in accordance with an embodiment of the invention.

FIG. 2 is a simplified cross-sectional view taken from the dashed line 1-1 of FIG. 1 and shows the substrate 10 with the at least one vent 14 in accordance with an embodiment of the invention. Also shown are a second side 20 or bottom surface of the substrate 10, a third side 22, which is an interior side wall of the vent 14, and a fourth side 24, which is an outer or exterior side surface of the substrate 10.

In FIG. 1 and FIG. 2, the substrate 10 is substantially square with opposing sides being substantially equal in height (e.g., sides 22 and 24 or sides 12 and 20). It will be appreciated that the substrate 10 may take different shapes and configurations, such as substantially circular, rectangular and the like. The vent 14 shown in FIGS. 1 and 2 are circular or round holes bored in the substrate 10 perpendicular with respect to the substrate top surface 12 and bottom surface 20. The vents 14 are holes that extend through the substrate 10 from the top surface 12 to the bottom surface 20. The vents 14 may be bored through the substrate 10 by mechanical drilling and the like. Other embodiments may have a different number of the vents 14 in the substrate 10, such as more or less than the three vents 14. Note, FIG. 1 shows the substrate 10 having three vents 14. The vents 14 may also be bored at angles other than 90° with respect to the surfaces 12, 20 of the substrate and may be located at different positions of the substrate 10. The dimensions of the vents 14 range from approximately 0.1 mm to 0.2 mm in diameter. The vents 14 can be in any shape, with the vents 14 shown being illustrative. Thus, it should be appreciated that the vents 14 can take different forms and sizes other than those shown. Examples of different configurations and arrangements of vents 14 formed in the substrate 10 in accordance with embodiments of the invention are shown and discussed in more detail with reference to FIGS. 19-23. It will be appreciated that there are no constraints on angle or shape of the vent 14 as long as the vent 14 allows gasses such as air to escape from within a mold cavity encompassing the substrate 10, as discussed in more detail below. After boring, machine drilling or the like the vents 14 in the substrate 10, the substrate 10 undergoes additional processing. Such additional processing may include, for example, electroless plating, patterning such as copper (Cu) patterning by methods such as chemical etching, solder mask printing, solder mask patterning, and the like.

The substrate 10 may be formed of any suitable materials commonly used in the industry, such as a core material comprising glass fibre, resin, fillers and the like with a top coating like a metal layer such as copper foil and the like. The substrate 10 may be a printed circuit board (PCB) substrate or leadframe fabricated of a material such as bismaleimide triazine (BT) epoxy/glass laminate with rolled copper traces on each side or the like. The substrate 10 may have electrical interconnects or vias that are bored, drilled or the like in the substrate 10. The substrate 10 may have a dry or wet film solder mask to ensure that all of the substrate vias or interconnects are completely tented.

FIGS. 3-9 show different stages of the packaging process of a semiconductor device including the substrate 10 with a vent 14 in accordance with an embodiment of the invention.

Figure 3:
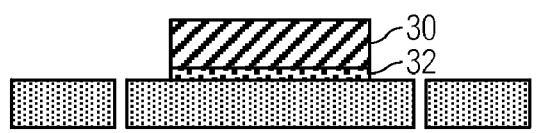
FIGS. 3-9 show different stages of packaging a semiconductor device having a substrate with an airvent in accordance with an embodiment of the invention.

FIG. 3 shows an integrated circuit or semiconductor die 30 affixed or bonded to the first side or top surface 12 of the substrate 10 with an epoxy resin or die bond material layer 32. The die 30 is bonded with epoxy dispensing type, print head type, or the like applications, and then cured at high curing temperatures in a box oven or the like. The die bond material layer 32 is a die attach adhesive such as resin or epoxy containing silver, epoxy die attach, and the like, and the thickness of the die attach adhesive may be approximately 40 μm, or the like.

Figure 4:
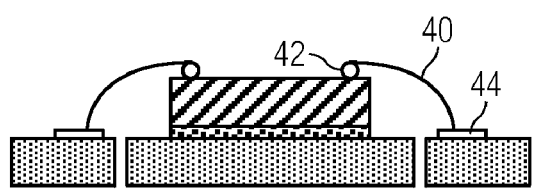

FIG. 4 shows a wire 40, wire bond 42 (ball bond), substrate wire bond pad 44. The wire 40 may be a conductive material such as aluminium (Al), copper (Cu), gold (Au), and the like with diameter such as 15 μm-20 μm, 18 μm to 50.8 μm, or the like, with a length of about 200 μm-250 μm, 1 mm to 5 mm, or the like. The wire 40 can be wire bonded to the top surface of the semiconductor die 30 by various methods such as for example with the ball bond 42, and the wire 40 can be attached or bonded to the substrate wire bond pad 44 by various methods such as are known in the art. The wire bonding may be performed using commercially available wire bonding apparatus. Traces (not shown) from the substrate wire bond pads 44 interconnect to vias (not shown) in the substrate 10 for electrical interconnection with bond pads for forming the inputs and outputs of the packaged device to allow for electrical interconnection with external circuitry (not shown).

Figure 5:
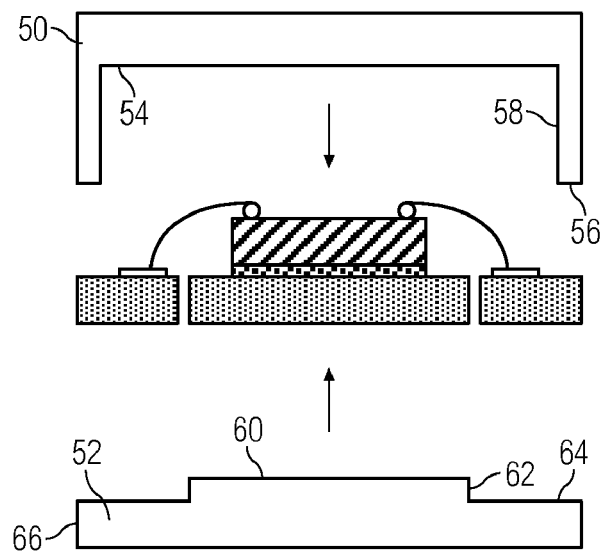

FIG. 5 shows a first or top mold form 50, and a second or bottom mold form 52 in accordance with an embodiment of the invention. The top mold form 50 has a first side 54, a second side 56, and a third side 58. The first side 54, as shown in FIG. 5, is an inner bottom surface that is horizontal and parallel to the substrate top surface 12 when the top mold form 50 is clamped to the substrate 10. The second side 56 is a bottom surface that contacts the top surface 12 of the substrate 10 when the top mold form is in a closed position. The third side 58 is an inner vertical surface of the top mold form 50.

Figure 6:
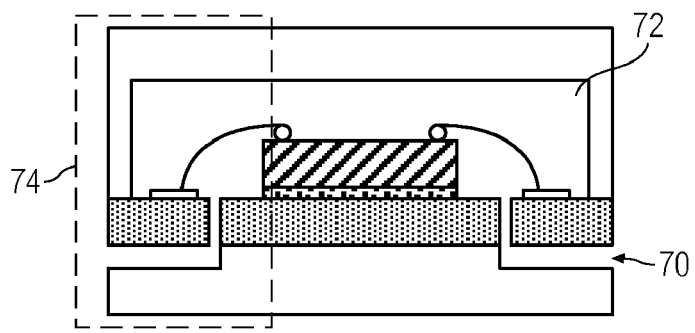
Figure 7:
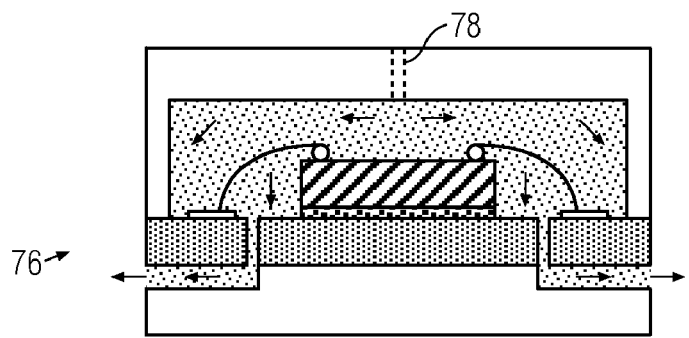
Figure 8:
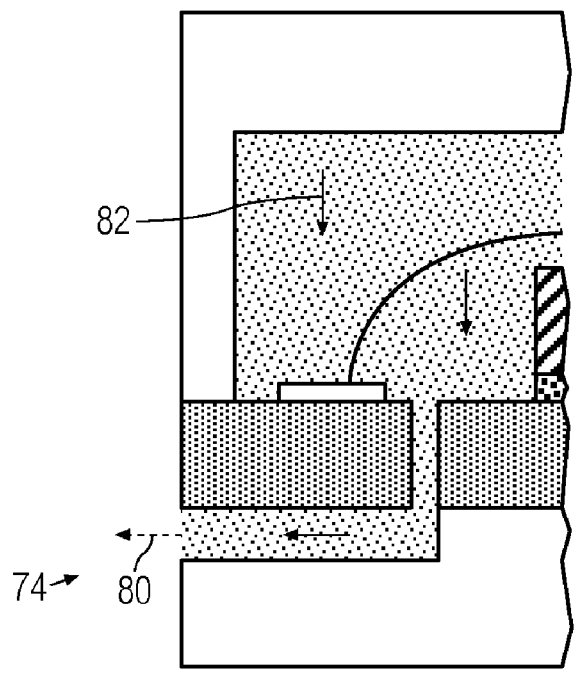

The bottom mold form 52 has a first surface 60, second surface 62, third surface 64, and fourth surface 66. The first surface 60 is a clamping surface for clamping to a central portion of the bottom surface 20 of the substrate 10. The second surface 62 is perpendicular to the bottom surface 20 of the substrate 10 and as is shown in FIGS. 6-8, is for forming an exit or escape channel for mold compound and gasses during an encapsulation process when the top and bottom mold forms 50, 52 are clamped to the substrate 10. The third surface 64 is parallel to the substrate bottom surface 20 and also is for forming the escape channel for the mold compound and gasses during the encapsulation process. The fourth surface 66 is an external side wall of second mold form 52. It will be appreciated that the top and bottom mold forms 50, 52 may have different configurations with sides and surfaces having different angles and dimensions specific for applications with various size and shape substrates.

FIG. 6 shows the first and second mold forms 50, 52 clamped to the top and bottom surfaces 12, 20 of the substrate 10 such that the substrate 10 and die 30 are enclosed within a cavity 72 formed by the first and second mold forms 50, 52 and a vent passageway or escape channel 70 is formed by the vent 14 and a gap between the bottom surface 20 of the substrate 10 and the third surface 64 of the bottom mold form 52. The escape channel 70 allows for mold compound and gasses within the cavity 72 to escape therefrom during the encapsulation process. The portion of FIG. 6 in dashed box 74 is shown in greater detail in FIG. 8.

The force of the top and bottom mold forms 50, 52 on the top and bottom surfaces 12, 20 of the substrate 10, respectively are sufficient to prevent flash or excess mold compound exuding from the seal formed between the mold forms 50, 52 and the substrate surfaces 12, 20, for example sufficient to prevent mold bleed out. It will be appreciated that the mold compound used as the mold material is highly active with adhesive materials that stick by chemically bonding to solder mask material well. The mold clamp tonnage applied varies depending on various factors as is known in the art, but generally is in the range of, for example, 20 tons to 40 tons. The mold forms 50, 52 may be temporarily chemically bonded to the surfaces 12, 20 of the substrate 10. The bottom surface 20 of the substrate 10 and the fourth surface 66 of the bottom mold form 52 form the escape channel 70. The substrate 10 with attached die 30 and wires 40 may be plasma cleaned to remove any contaminants therefrom, and to activate the solder mask surface on the substrate 10 to improve the chemical bond between the mold adhesive resin and the solder mask surface.

FIG. 7 illustrates an encapsulation process 76 in which mold compound is injected into the cavity 72 to encapsulate the substrate 10, die 30 and wires 40 with the mold compound. The arrows illustrate the flow of the mold compound and gasses within the cavity 72. The mold compound may be injected into the cavity via an injection port or transfer molding entrance 78 and then the mold compound flows through the cavity 72 to cover the substrate 10, die 30 and wires 40. Excess mold compound as well as gasses trapped within the cavity 72 exit the cavity 72 by way of the substrate vents 14 and escape channels 70. The mold injection port 78 may be positioned at different locations in the first mold form 50 such as for example from a corner, top center (as shown in FIG. 7), or side the form 50, or the like. Wherever the mold injection port 78 is located, the present invention still provides a vent 14 in the substrate 10 to allow for excess mold material to escape or drain from the mold cavity 72 and to reduce, limit or prevent mold flash.

FIG. 8 is a greatly enlarged view of the portion of FIG. 6 in dashed box 74. FIG. 8 illustrates with dashed arrows 80 gasses escaping or being expelled from the mold cavity 72 by way of the vent 14 and escape channel 70, while solid arrows 82 show excess mold compound escaping or being expelled from the mold cavity 72 by way of the vent 14 and escape channel 70.

Figure 9:
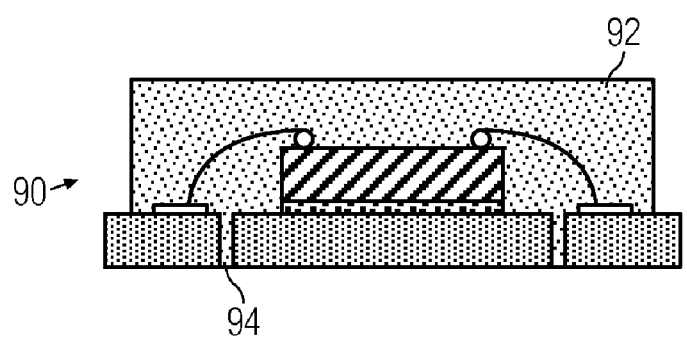

FIG. 9 shows a finished packaged semiconductor device 90, which has a substrate with a vent that is filled with mold compound 92. The mold compound seals the vent 14 so the dust, dirt, gasses, etc. cannot penetrate the packaged device 90. As will be understood by those of skill in the art, additional processing steps may be performed to form the packaged device 90, such as attaching solder balls to the bottom surface of the substrate. For example, solder balls (not shown) may be attached or gang dipped to solder pads (not shown) on the underside of the substrate to form a ball grid array (BGA) type semiconductor package. The BGA type package then may be mounted on a printed circuit board (PCB), as is known in the art.

The present invention is not limited to a particular mold compound 92. Generally, the physical properties required for mold compound include spiral flow, gel time, viscosity, filler content, and the like. The thermal properties include transition temperature, coefficient of thermal expansion, thermal conductivity, and the like. All of the above mentioned properties and materials impact the molding process characterization and package reliability, as is known in the art.

Figure 10:
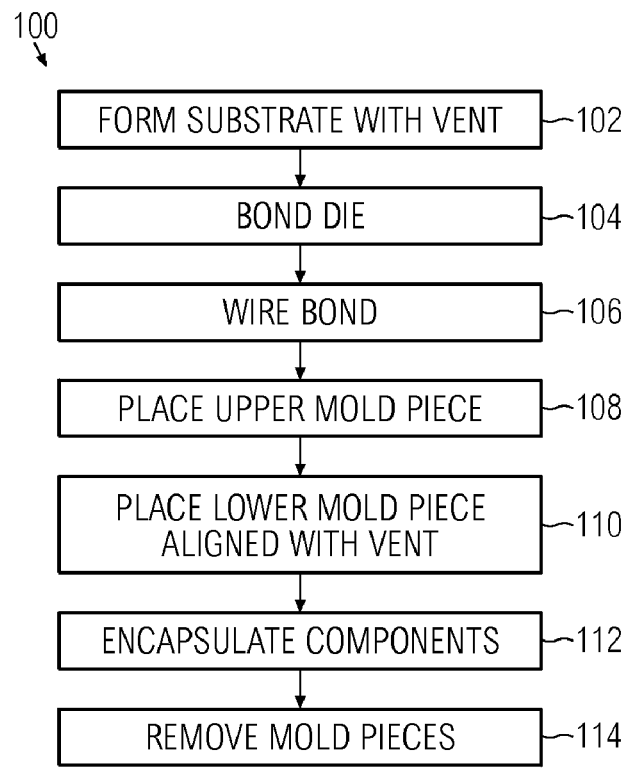
FIG. 10 is a flow chart showing a method of packaging a semiconductor device having a substrate with a vent in accordance with an embodiment of the invention.

FIG. 10 is a flow chart showing a method 100 of packaging a semiconductor device having a substrate with a vent in accordance with an embodiment of the invention. The method 100 includes providing a substrate with a vent 102, attaching a die to the substrate 104, wire bonding to electrically connect the die to the substrate 106, placing an upper mold form or piece over the substrate 108, placing a lower mold form or piece beneath the substrate 110 and clamping the mold pieces together to enclose the substrate, die and wires within a cavity formed by the upper and lower mold forms. The vent is aligned with the lower mold form so that an escape channel is formed that extends from a bottom surface of the substrate where the vent is located to an outer side or exterior of the lower mold form. At step 112 mold compound is injected into the cavity to encapsulate the substrate, die and wires. After encapsulation, the upper and lower mold pieces are removed.

Figure 11:
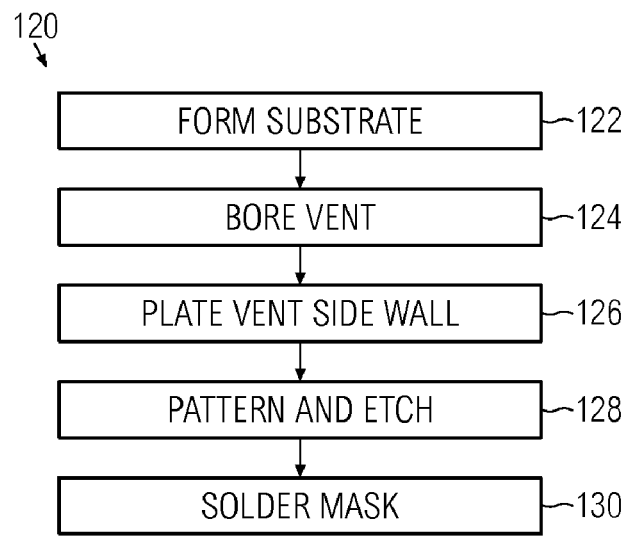
FIG. 11 is a flow chart of a method of forming a substrate with a vent in accordance with an embodiment of the invention.

FIG. 11 is a flow chart showing a method 120 of forming a substrate with a vent in accordance with an embodiment of the invention. The method 120 includes forming the substrate 122, boring a vent 124 into the substrate, plating the exposed sidewalls of the bored vent 126, patterning and etching the surface of the substrate 128, and applying a solder mask 130. Each of these steps, individually, where not already explained in detail, are understood by those of skill in the art and therefore, further description has been omitted so as not to obfuscate the invention.

Figure 12:
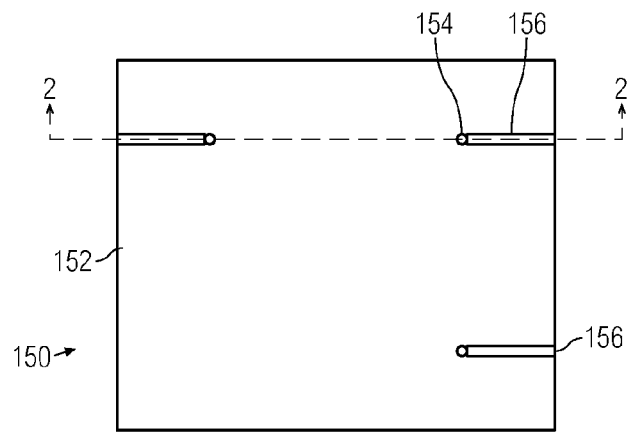
FIG. 12 is a simplified bottom plan view of a substrate with a vent in accordance with an embodiment of the invention.

FIG. 12 is a simplified bottom plan view of a substrate 150 having a second side or bottom surface 152 and a plurality of vents 154, three of which are shown. The vents 154 each are connected to a vent channel 156 in accordance with an embodiment of the invention. The vent channels 156 in FIG. 12 are all parallel with respect to each other and perpendicular to a side edge of the substrate 150. However, it should be appreciated that the vent channels 156 do not all have to be oriented parallel with each other or perpendicular to a side edge of the substrate and that the channels 156 may have different configurations for example perpendicular or at acute or obtuse angles with respect to each other or the side of or substrate.

Figure 13:
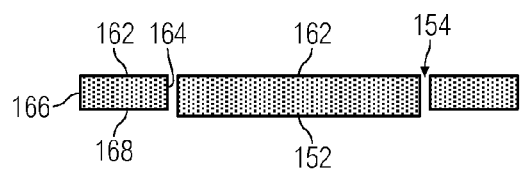
FIG. 13 is a simplified cross-sectional view taken from the dashed line 2-2 of FIG. 11 of a substrate with a vent in accordance with an embodiment of the invention.

FIG. 13 is a simplified cross-sectional view taken along dashed line 2-2 of FIG. 12 of the substrate 150 with the vent 154s and vent channels 156. The substrate 150 has a first side 162, the second side 152 opposing the first side 162, a third side 164, a fourth side 166, and a fifth side 168. The first to fourth sides 162, 152, 164, 166 of the substrate 150 of FIGS. 12 and 13 are similar to the first to fourth sides 12, 20, 22, 24 of the substrate 10 shown in FIGS. 1 and 2. The fifth side 168 of the substrate 150 is provided to form the vent channel 156. The vent channel 156 may have a depth into the substrate in the range of approximately 30 µm to 40 µm, with a width in the range of approximately 100 µm to 1 mm. Of course, it will be appreciated that the vent channel 156 may have varying sizes and configurations.

Figure 14:
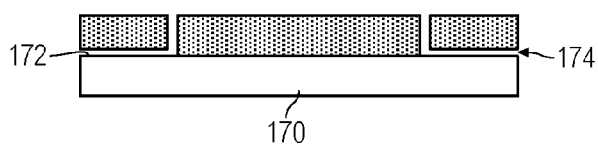
FIGS. 14-16 show different stages of packaging a semiconductor device having a substrate with a vent in accordance with embodiment of the invention.
Figure 15:
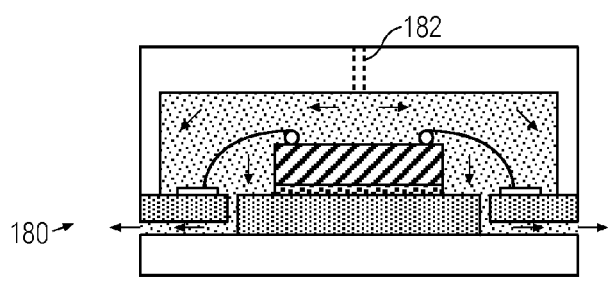
Figure 16:
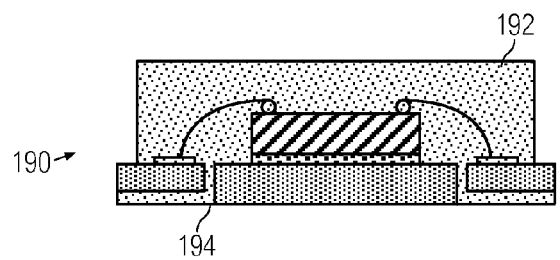

FIGS. 14-16 show different stages in the assembly or packaging of a semiconductor device having the substrate 150 with vent 154 in accordance with embodiment of the invention. The stages are similar to the stages shown in FIGS. 3-9 and for simplicity of illustrating the invention, only the differences are discussed in detail.

In FIG. 14, a second or bottom mold form 170 is shown, with the substrate bottom side 152 contacting a first side 172 of the bottom mold form 170. The vent channel 156 is formed at 174 between the fifth side 168 of the substrate 150 and the bottom mold form 170. That is, as can be seen in FIG. 13, the fifth side 168 although parallel to, is in a different plane than the second side 152. Thus, a gap is formed between the bottom mold form 170 and the substrate fifth side 168 when the bottom mold form is clamped or otherwise affixed to the substrate 150.

FIG. 15 shows the substrate 150 including a semiconductor die affixed and electrically connected to the substrate 150 enclosed within a top mold form and the bottom mold form 170. An encapsulation process is 180 is illustrated, with mold compound being injected into the mold cavity at injection port 182. Movement or flow of the mold compound and gasses within the mold cavity is shown with arrows. As illustrated, excess mold compound and the gasses exit the mold cavity by way of the channel 156 formed between the first side 172 of the bottom mold form 170 and the fifth side of the substrate 150.

FIG. 16 shows one embodiment of a packaged semiconductor device 190 formed using the substrate 152. The packaged semiconductor device 190 includes mold compound 192 that covers the top or first surface 152 of the substrate 150, the semiconductor die, and wires. The mold compound 192 also fills the channels 156 and thus is shown at 194 where it also covers the fifth side 168 of the substrate 150. It is understood that the packaged device 190 may undergo further processing in which all or a portion of the mold compound covering the fifth side of the substrate is removed so that solder balls may be attached thereto.

Figure 17:
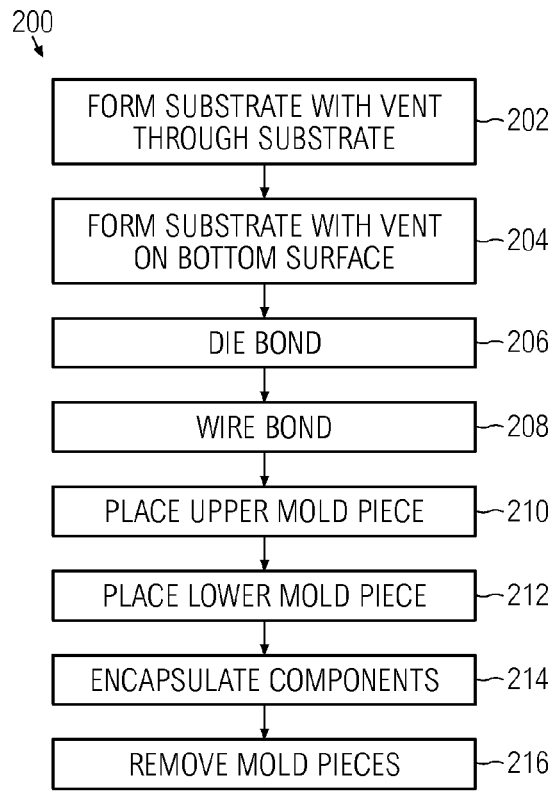
FIG. 17 is a flow chart of a method of packaging a semiconductor device having a substrate with a vent in accordance with an embodiment of the invention.

FIG. 17 is a flow chart showing a method 200 of packaging a semiconductor device having a substrate with a vent in accordance with an embodiment of the invention. The method 200 includes forming 202 a substrate with a vent through the substrate, forming 204 a vent channel on a bottom surface of the substrate, bonding 206 a semiconductor die to the substrate, bonding 208 wires to interconnect the die with the substrate, placing and clamping 210 an upper mold form, placing and clamping 212 a lower mold form, encapsulating 214 the substrate, die and wires, and removing 216 the mold forms.

Figure 18:
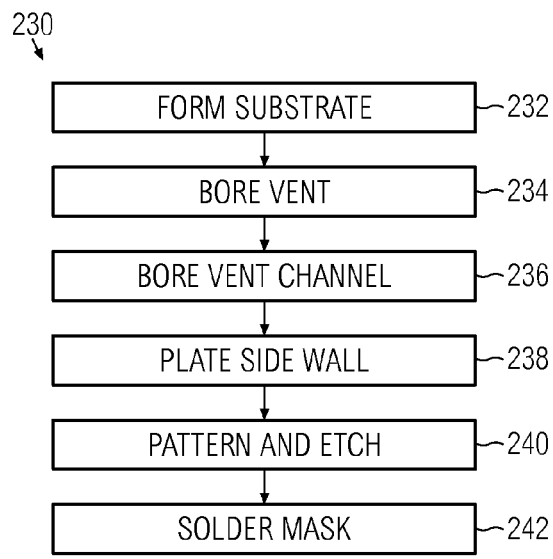
FIG. 18 is a flow chart of a method of forming a substrate with a vent in accordance with an embodiment of the invention.

FIG. 18 is a flow chart showing a method of forming a substrate with a vent and vent channel in accordance with an embodiment of the invention. The method 230 includes forming 232 the substrate, boring 234 the a vent in the substrate, boring 236 a vent channel, plating 238 the exposed sidewalls of the bored vent and vent channel, pattern and etch 240 the surface of the substrate, and forming 242a solder mask on the surface of the substrate.

FIGS. 19-22 are simplified top plan views of a substrate with an arrangement of a plurality of vents and a mold injection port in accordance with an embodiment of the invention. The position of the vents may be selected based on the specific application. For example, the vents may be positioned or shaped relative to the position of the mold injection port, shape of the substrate, position of the other components of the semiconductor package such as the die or chip, wires, and the like. The vents are arranged to maximize the effectiveness of the vents to allow gasses to escape from within the cavity during encapsulation.

Figure 19:
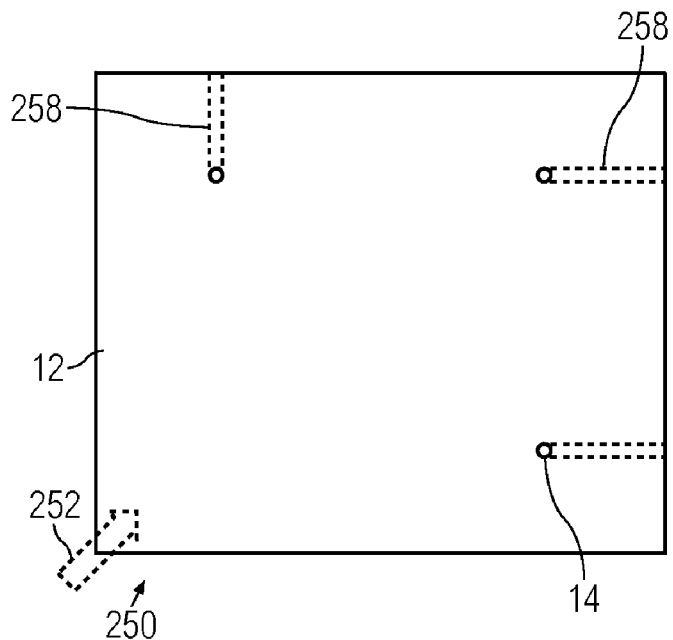
FIGS. 19-22 are simplified top plan views of a substrate with an arrangement of a plurality of vents and a mold injection port in accordance with an embodiment of the invention.

FIG. 19 shows a substrate with an arrangement 250 of three vents 14 arranged proximate to three of the four corners of the substrate similar to the substrate shown in FIG. 1 in accordance with an embodiment of the invention. In FIG. 19, the mold injection port or gate 252 is shown by dashed arrow in a fourth corner of the substrate. Vent channels 258 are shown that extend from each vent 14 to a side of the substrate or mold form. Some or all of the vents 14 are formed in either or both the substrate and/or the mold form as described above. It will be appreciated that the vent channels may have different orientations with respect to each the other, for example, each vent may form a parallel, perpendicular, or other orientation with respect to the other vents formed in either the substrate or mold forms.

Figure 20:
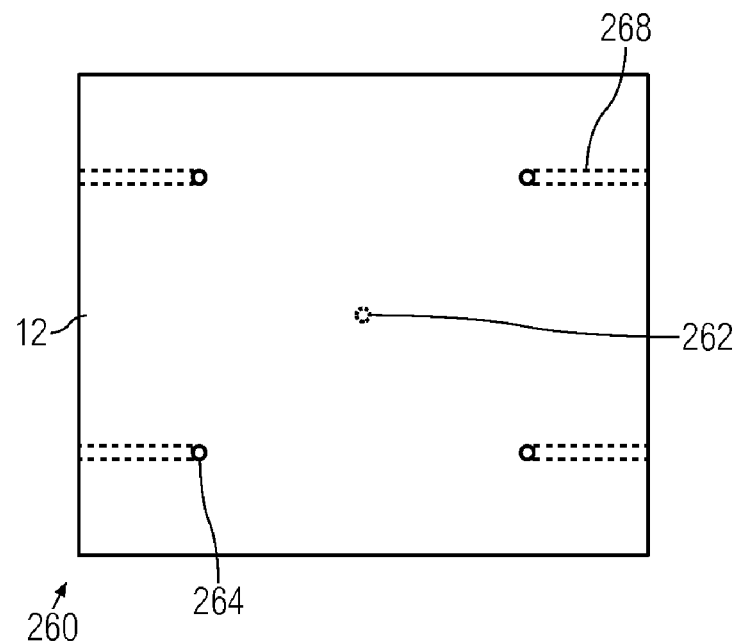

FIG. 20 shows an embodiment of a substrate with an arrangement 260 of a mold injection port or gate 262 located on the top or center gate of the mold form as shown by dashed circle, and four vents 264 positioned in each corner of the substrate. Vent channels 268 are shown with dashed lines that extend from each vent to a side of the substrate.

Figure 21:
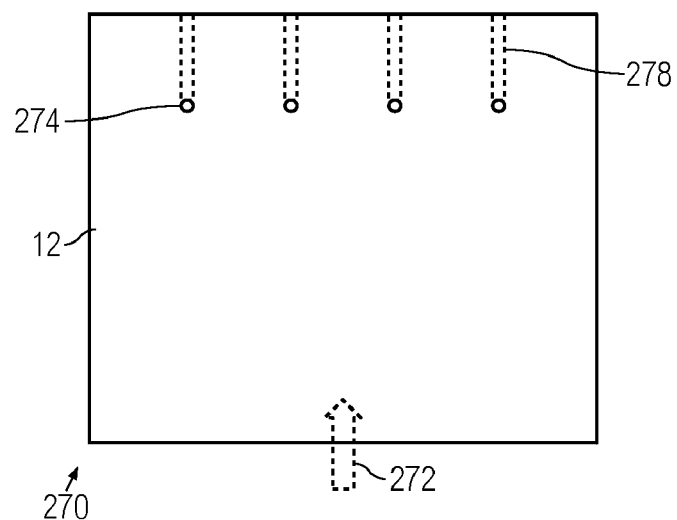

FIG. 21 shows an embodiment of a substrate with an arrangement 270 of a mold injection port or gate 272 located on the side gate of the substrate of the mold form as shown by dashed arrow, and four airvents 274 positioned on the side opposite the mold injection port 272. Vent channels 278 are shown with dashed lines that extend from each vent to a side of the substrate.

Figure 22:
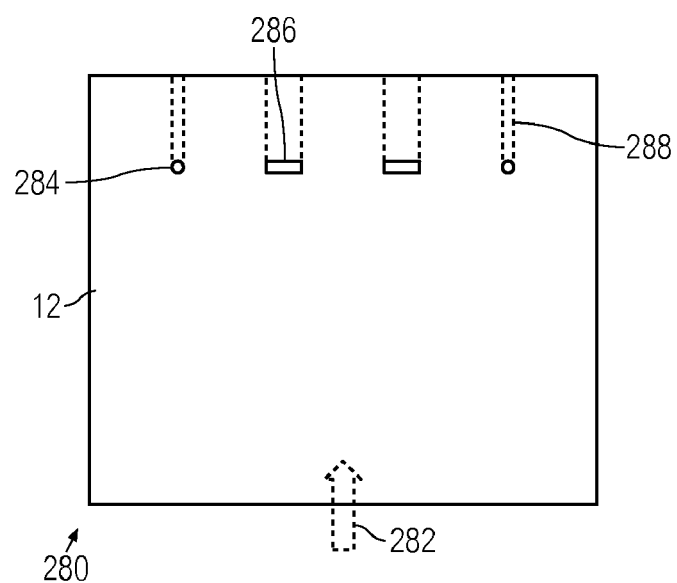

FIG. 22 shows an embodiment of a substrate with an arrangement 280 of a mold injection port or gate 282 located on the side gate of the substrate similar to FIG. 21 as shown by dashed arrow, and four vents of different shape such as circular vents 284 and rectangular vents 286 positioned on the side opposite the mold injection port 282. Vent channels 288 are shown with dashed lines that extend from each vent to a side of the substrate.

The packaged semiconductor described herein is shown as a singular device for illustrative purposes. It will be appreciated that the packaged semiconductor may be processed as described herein in a batch processing of an array or plurality of devices on a substrate, and undergo a further singulation process to form the individual packaged semiconductors.

Figure 23:
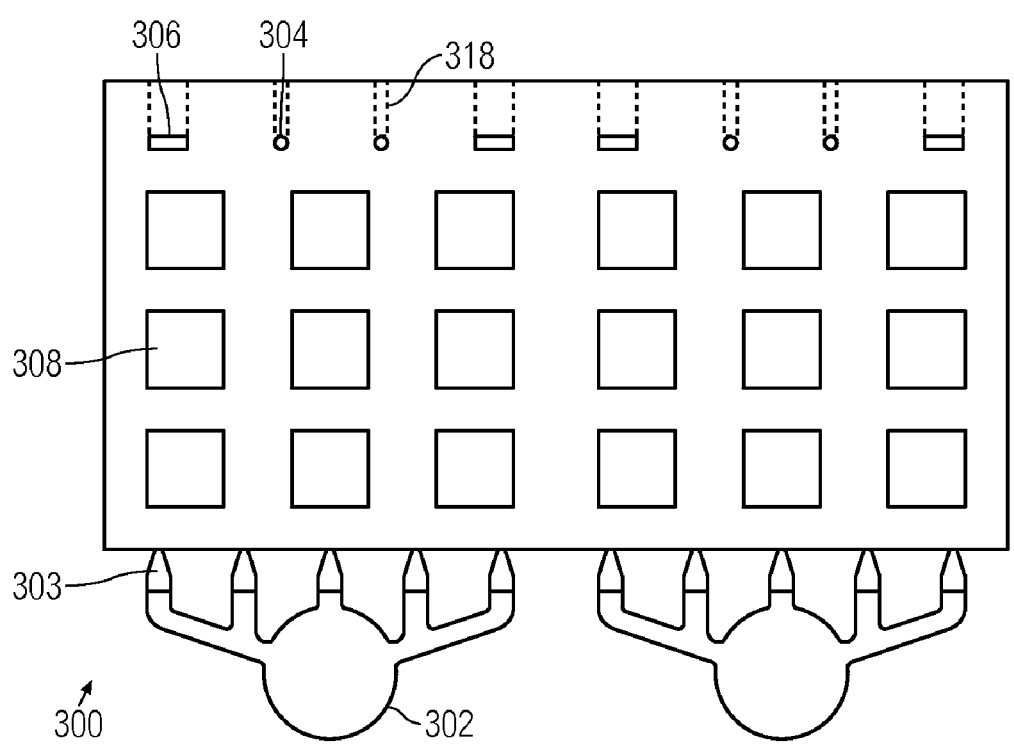
FIG. 23 is a simplified top plan view of a substrate with an arrangement of a plurality of airvents for processing a plurality of devices on a single substrate with a mold array with multiple mold injection ports in accordance with an embodiment of the invention.

FIG. 23 shows an embodiment of a simplified top plan view of a substrate with a mold array arrangement 300 with multi-injection points 302 each with a plurality of mold injection ports 303 for providing mold transfer to a cavity with a substrate having a plurality of vents 304, 306 for processing a plurality of devices 308 on the single substrate. Such a device is a mold array plastic ball grid array (MAPBGA). The vents are shown with different shape such as circular vents 304 and rectangular vents 306, similar to the vent arrangement shown in FIG. 22. The vents 304, 306 are shown positioned on the side opposite the mold injection ports 303 of the mold multi-injection points 302. Vent channels 318 are shown with dashed lines that extend from each vent to a side of the substrate.

Embodiments of the invention have been described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by the applicable law. Moreover, any combination of the above-described elements in all possible variations thereof is encompassed by the invention unless otherwise indicated herein or otherwise clearly contradicted by context.

What is claimed is:

1. A method of packaging a semiconductor device, comprising:
   providing a substrate having a die attach pad surrounded by a plurality of substrate wire bond pads, and a vent forming a hole from a first side of the substrate to a second side of the substrate, wherein the vent is located between the die attach pad and at least one of the wire bond pads;
   placing a semiconductor die on the die attach pad on the first side of the substrate;
   electrically connecting the die with the wire bond pads with wires using a wire bonding process;
   clamping a first mold form to the first side of the substrate to form a mold cavity between the first mold form and the first side of the substrate with the semiconductor die;
   injecting a mold compound into the mold cavity by way of an injection port in the first mold form, wherein the mold compound and gas within the mold cavity exit the mold cavity by way of the vent in the substrate; and
   removing the first mold form piece from the substrate, thereby forming a packaged semiconductor device, the mold compound covers the die and the wires, and fills the vent.

2. The method of claim 1, further comprising clamping a second mold form to the second side of the substrate to extend the mold cavity between the second mold form to the second side of the substrate.

3. The method of claim 2, further comprising forming a vent channel between the second side of the substrate and the second mold piece, wherein the vent channel extends along a length of at least one of the wire bond pads and wherein the vent channel communicates with the vent such that the mold compound and gasses exit from the mold cavity by way of the vent and the vent channel.

4. The method of claim 1, wherein a bottom surface of the die attach pad lies in a first plane and bottom surfaces of the wire bond pads lie in a second plane that is parallel and spaced from the first plane, and wherein the second side of the substrate comprises a vent channel extending from the vent of the second side of the substrate to a perimeter of the second side of the substrate in a space between the first plane and the second plane, and wherein the mold compound fills said space such that an exposed bottom surface of the mold compound is planar with a bottom surface of the die attach pad of the substrate.

* * * * *